(12) United States Patent
Yuzurihara et al.

(10) Patent No.: US 7,473,948 B2
(45) Date of Patent: Jan. 6, 2009

(54) PHOTOELECTRIC CONVERSION DEVICE, METHOD OF MANUFACTURING PHOTOELECTRIC CONVERSION DEVICE, AND IMAGE PICKUP SYSTEM

(75) Inventors: Hiroshi Yuzurihara, Atsugi (JP); Ryuichi Mishima, Machida (JP); Takanori Watanabe, Yamato (JP); Takeshi Ichikawa, Hachioji (JP); Seiichi Tamura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/941,675

(22) Filed: Nov. 16, 2007

(65) Prior Publication Data

US 2008/0073737 A1 Mar. 27, 2008

Related U.S. Application Data

(62) Division of application No. 11/003,444, filed on Dec. 6, 2004, now Pat. No. 7,323,731.

(30) Foreign Application Priority Data

Dec. 12, 2003 (JP) .............................. 2003-415011
Aug. 31, 2004 (JP) .............................. 2004-252310

(51) Int. Cl.
*H01L 29/06* (2006.01)

(52) U.S. Cl. ...................... 257/292; 257/295; 257/535; 257/E27.048; 257/E29.342; 257/E29.343; 361/301.4; 361/306.3; 361/321.2

(58) Field of Classification Search ................ 257/291, 257/292, E27.133; 438/57, 60, 519, 527, 438/E21.043, E21.057
See application file for complete search history.

(56) References Cited

U.S. PATENT DOCUMENTS 4,142,200 A 2/1979 Mizushima et al. ........... 357/30

(Continued)

FOREIGN PATENT DOCUMENTS

CN 1453628 A 11/2003

(Continued)

OTHER PUBLICATIONS

Chinese Official Communication Dated Nov. 5, 2003 Regarding Chinese Patent Application No. 2004101007057.

*Primary Examiner*—Ngan Ngo
*Assistant Examiner*—Benjamin Tzu-Hung Liu
(74) *Attorney, Agent, or Firm*—Fitzpatrick, Cella, Harper & Scinto

(57) ABSTRACT

A photoelectric conversion device comprising a semiconductor substrate of a first conduction type, and a photoelectric conversion element having an impurity region of the first conduction type and a plurality of impurity regions of a second conduction type opposite to the first conduction type. The plurality of second-conduction-type impurity regions include at least a first impurity region, a second impurity region provided between the first impurity region and a surface of the substrate, and a third impurity region provided between the second impurity region and the surface of the substrate. A concentration C1 corresponding to a peak of the impurity concentration in the first impurity region, a concentration C2 corresponding to a peak of the impurity concentration in the second impurity region and a concentration C3 corresponding to a peak of the impurity concentration in the third impurity region satisfy the following relationship:

$C2 < C3 < C1$.

7 Claims, 14 Drawing Sheets

U.S. PATENT DOCUMENTS

| | | | |
|---|---|---|---|
| 4,268,845 A | 5/1981 | Koike et al. | 357/30 |
| 5,201,681 A | 4/1993 | Okunuki et al. | 445/24 |
| 5,361,015 A | 11/1994 | Okunuki et al. | 313/309 |
| 5,428,237 A | 6/1995 | Yuzurihara et al. | 257/349 |
| 5,458,755 A | 10/1995 | Fujiyama et al. | 204/224 R |
| 5,466,961 A | 11/1995 | Kikuchi et al. | 257/379 |
| 5,561,317 A | 10/1996 | Momma et al. | 257/620 |
| 5,598,037 A | 1/1997 | Kikuchi et al. | 257/773 |
| 5,612,230 A | 3/1997 | Yuzurihara et al. | 437/21 |
| 5,693,959 A | 12/1997 | Inoue et al. | 257/66 |
| 5,700,719 A | 12/1997 | Yuzurihara et al. | 437/193 |
| 5,731,131 A | 3/1998 | Momma et al. | 430/311 |
| 5,898,195 A | 4/1999 | Harada | 257/223 |
| 5,903,043 A | 5/1999 | Ichikawa et al. | 257/532 |
| 5,918,115 A | 6/1999 | Kikuchi et al. | 438/138 |
| 6,049,235 A | 4/2000 | Ichikawa et al. | 327/51 |
| 6,373,099 B1 | 4/2002 | Kikuchi et al. | 257/331 |
| 6,483,129 B2 | 11/2002 | Rhodes et al. | |
| 6,504,194 B1 | 1/2003 | Miida | 357/30 |
| 2001/0000623 A1 | 5/2001 | Nozaki et al. | 257/292 |
| 2002/0063302 A1* | 5/2002 | Furumiya et al. | 257/432 |
| 2002/0125513 A1 | 9/2002 | Inoue | 257/291 |
| 2003/0085399 A1* | 5/2003 | Inagaki | 257/53 |
| 2003/0202114 A1 | 10/2003 | Takizawa et al. | 348/335 |
| 2004/0017496 A1 | 1/2004 | Koizumi et al. | 348/308 |

FOREIGN PATENT DOCUMENTS

| | | |
|---|---|---|
| JP | 63-174358 | 7/1988 |
| JP | 3-159172 | 7/1991 |
| JP | 6-297369 | 10/1994 |
| JP | 11-274454 A | 10/1999 |
| JP | 2000-150848 A | 5/2000 |
| JP | 2002-170945 | 6/2002 |

* cited by examiner

PHOTOELECTRIC CONVERSION DEVICE, METHOD OF MANUFACTURING PHOTOELECTRIC CONVERSION DEVICE, AND IMAGE PICKUP SYSTEM

CROSS REFERENCE TO RELATED APPLICATION

This is a divisional application of U.S. patent application Ser. No. 11/003,444, filed Dec. 6, 2004 now U.S. Pat. No. 7,323,731.

BACKGROUND OF THE INVENTION

1. Field of the Invention

The present invention relates to a photoelectric conversion device, a method of manufacturing the photoelectric conversion device and, more particularly, to a CMOS area sensor, a method of manufacturing the CMOS area sensor, and an image pickup system using the CMOS sensor.

2. Related Background Art

Charge-coupled devices (CCD) are known as a solid-state image pickup device which converts an image signal into an electric signal. CCDs have a photodiode array in which a pulse voltage is applied to electric charges accumulated in photodiodes to read out the charges as an electrical signal. In recent years, complementary metal-oxide-semiconductor (CMOS) area sensors having photodiodes and peripheral circuits including MOS transistors into one chip have been used as a solid-state image pickup device. CMOS area sensors have the advantages of having a lower power consumption and a lower drive power in comparison with CCDs and the demand for them is expected to increase in future.

A CMOS area sensor will be described with reference to FIG. 9 as a typical example of a photoelectric conversion device. FIG. 9 is a schematic cross-sectional view of a photodiode portion 301 and a transfer MOS transistor portion 302 of the CMOS area sensor. FIG. 9 shows an n-type silicon substrate 303, a p-type well 304, a gate electrode 307 of the transfer MOS transistor, an n-type charge accumulation region 308 of the photodiode, a surface p-type region 309 of the photodiode for forming the photodiode in a buried structure, a field oxide film 305 for element separation, an n-type high-concentration region 310 in which floating diffusion is formed and which functions as a drain region of the transfer MOS transistor, a silicon oxide film 311 for insulation between the gate electrode and a first wiring layer 313, a contact plug 312, the first wiring layer 313, an interlayer insulating film 314 for insulation between the first wiring layer 313 and a second wiring layer 315, the second wiring layer 315, an interlayer insulating film 316 for insulation between the second wiring layer 315 and a third wiring layer 317, the third wiring layer 317, and a passivation film 318. A color filter layer (not shown) is formed on the passivation film 318, and a microlens (not shown) is formed on the color filter layer for an improvement in sensitivity. Light incident on the surface enters the photodiode through an opening defined in the third wiring layer 317. The light is absorbed in the n-type charge accumulation region 308 or the p-type well region 304 to generate electron-hole pairs. The electrons in the electron-hole pairs are accumulated in the n-type charge accumulation region 308.

As a CMOS area sensor structure according to a conventional art, a structure having a carrier profile such as shown in FIG. 10 (FIG. 6 of U.S. Pat. No. 6,483,129) is known. This structure has a high-concentration impurity diffusion region 6A in a deep region in a substrate and is thought to have the effect of improving the sensitivity by increasing the efficiency with which electric charge generated by absorption of light in a well is extracted to the surface side.

In conventional photoelectric conversion devices, particularly CMOS area sensors, a concentration distribution is formed so that the concentration decreases gradually in the substrate depth direction, as shown in FIG. 11, because the well layer of the photodiode is formed by performing thermal diffusion after ion implantation. As a result, a structure having no potential barrier in the substrate depth direction is formed, and part of light absorbed in the p-type well is lost in the direction of the substrate and does not contribute to the photoelectrically converted signal. In particular, a problem that the necessary sensitivity cannot be obtained has arisen with the reduction in pixel size. Also, there are few parameters of manufacturing conditions which can be handled at the time of control of characteristics such as the sensitivity, the number of saturated charges and characteristics of transfer from the photodiode to floating diffusion. Therefore there is also a problem that the performance requirements relating to such characteristics cannot be satisfied.

On the other hand, the structure shown in FIG. 10 of the above-mentioned patent document has a high-concentration impurity diffusion region in a deep region of a substrate and is thought to be effective in improving the sensitivity. However, the number of parameters of manufacturing conditions which can be handled at the time of control of various characteristics, including the number of saturated charges and characteristics of transfer from the photodiode to floating diffusion, which are to be simultaneously satisfied, is small and the performance requirements relating to such characteristics cannot be satisfied. In the case of a simple retrograde well structure such as that described in the above-mentioned U.S. Pat. No. 6,483,129, a dark current generated in the substrate leaks and enters the photodiode to cause degradation of the performance of the sensor. That is, no technical theme has been found to simultaneously achieve an improvement in sensitivity, an increase in the number of saturated charges and an improvement in transfer efficiency.

SUMMARY OF THE INVENTION

In view of the above-described problems, an object of the present invention is to provide a photoelectric conversion device typified by a CMOS area sensor capable of improving various characteristics including the photodiode sensitivity, and a method of manufacturing the photoelectric conversion device.

According to one aspect of the present invention, an arrangement specific to the present invention is a photoelectric conversion device comprising a semiconductor substrate of a first conduction type, and a photoelectric conversion element having an impurity region of the first conduction type and a plurality of impurity regions of a second conduction type opposite to the first conduction type, the plurality of second-conduction-type impurity regions including at least a first impurity region, a second impurity region provided between the first impurity region and a surface of the substrate, and a third impurity region provided between the second impurity region and the surface of the substrate, wherein a concentration C1 corresponding to a peak of the impurity concentration in the first impurity region, a concentration C2 corresponding to a peak of the impurity concentration in the second impurity region and a concentration C3 corresponding to a peak of the impurity concentration in the third impurity region satisfy the following relationship:

$$C2 < C3 < C1.$$

According to another aspect of the present invention, there is provided a photoelectric conversion device comprising a semiconductor substrate of a first conduction type, and a photoelectric conversion element having an impurity region of the first conduction type and a plurality of impurity regions of a second conduction type opposite to the first conduction type, the plurality of second-conduction-type impurity regions being placed so as to extend continuously to a position below an element-separating region adjacent to the photoelectric conversion element.

According to still another aspect of the present invention, there is provided a photoelectric conversion device comprising a semiconductor substrate of a first conduction type, and a photoelectric conversion element having an impurity region of the first conduction type and a plurality of impurity regions of a second conduction type opposite to the first conduction type, wherein a concentration C1 corresponding to a peak of the impurity concentration in the first impurity region adjacent at least to the first-conduction-type impurity region in the plurality of impurity regions is in a range: $3\times10^{15}$ cm$^{-3}$<C1<$2\times10^{17}$ cm$^{-3}$.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DESCRIPTION OF THE PREFERRED EMBODIMENTS

According to the present invention, an impurity region of a first conduction type in a photodiode constituting a photoelectric conversion element is formed of a plurality of impurity regions having impurity concentration peaks, and a concentration C1 corresponding to a peak of the impurity concentration in the first impurity region, a concentration C2 corresponding to a peak of the impurity concentration in the second impurity region provided between the first impurity region and a substrate surface, and a concentration C3 corresponding to a peak of the impurity concentration in the third impurity region provided between the second impurity region and the substrate surface and formed adjacent to (abutting on) the second-conduction-type impurity region forming the photodiode are set in a relationship: C2<C3<C1.

In this arrangement, photoelectrically converted carriers are prevented from being lost in the direction of the substrate and the amount of noise charge entering from the substrate can be reduced, thereby improving the sensitivity and increasing the number of saturated electrons and the transfer efficiency.

The arrangement may alternatively be such that the impurity region of the first conduction type in the photodiode constituting the photoelectric conversion element is formed of a plurality of impurity regions having impurity concentration peaks, and a concentration C corresponding to a peak of the impurity concentration in an impurity region formed adjacent to (abutting on) the second-conduction-type impurity region forming the photodiode in the plurality of impurity regions is set so as to satisfy $3\times10^{15}$ cm$^{-3}$<C<$2\times10^{17}$ cm$^{-3}$. This arrangement makes it possible to achieve an increase of saturated electrons and transfer efficiency.

Embodiments of the present invention will be described below with reference to the accompanying drawings.

First Embodiment

Figure 1:
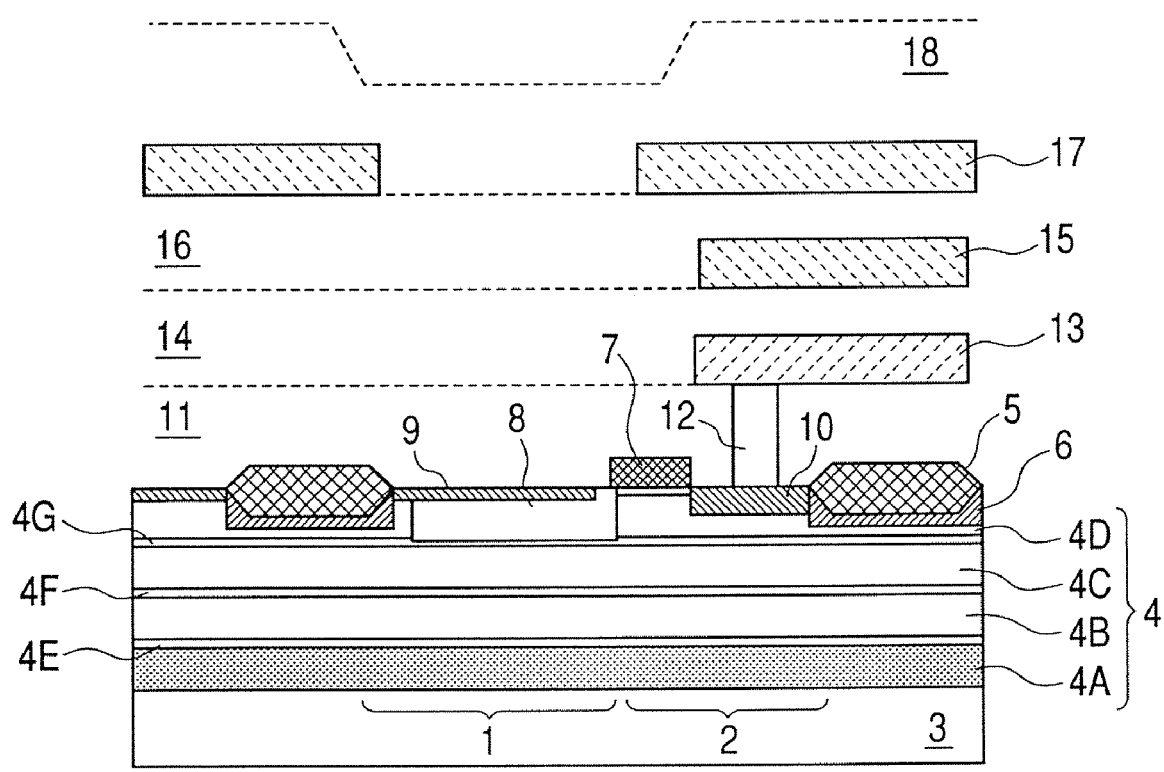
FIG. 1 is a cross-sectional view of a CMOS area sensor in a first embodiment of the present invention.

FIG. 1 is a schematic cross-sectional view of an embodiment of the present invention, showing a photodiode portion 1 and a transfer MOS transistor portion 2 constituting a photoelectric conversion element of a CMOS area sensor. The CMOS area sensor has an n-type silicon substrate 3 and a p-type well 4 including a plurality of p-type impurity regions. In this embodiment, impurity regions 4A to 4D are provided. N-type impurity regions 4E to 4G are interposed between the impurity regions 4A and 4B, between the impurity regions 4B and 4C and between the impurity regions 4C and 4D, respectively. The transfer MOS transistor has a gate electrode 7. An n-type impurity region (charge accumulation region) 8 forms a photodiode. A surface p-type impurity region (surface charge recombination region) 9 is provided for forming the photodiode in a buried structure. The CMOS area sensor has a field oxidation film 5 for element separation and an n-type impurity region 10 which functions as floating diffusion to which electric charge is transferred from the charge accumulation region 8. The p-type impurity regions 4A to 4D form p-type impurity regions for forming the photodiode, and the n-type impurity region 8 forms an n-type impurity region for forming the photodiode. The CMOS area sensor also has a silicon oxide film 11 which functions as an interlayer insulating film for insulation between the gate electrode and a first wiring layer 13, a contact plug 12, the first wiring layer 13, an interlayer insulating film 14 for insulation between the first wiring layer 13 and a second wiring layer 15, the second wiring layer 15, an interlayer insulating film 16 for insulation between the second wiring layer 15 and a third wiring layer 17, the third wiring layer 17, and a passivation film 18. A color filter layer (not shown) is formed on the passivation film 18, and a microlens (not shown) is formed on the color filter layer for an improvement in sensitivity. While three wiring layers are formed in this embodiment, an arrangement using one wiring layer or two wiring layers does not conflict with the essential object of the present invention in ensuring the desired optical characteristics depending on a specification of the sensor. To further increase the rate of acceptance of light, a lens (in-layer lens) may be provided on the light receiving portion side of the color filter layer.

Figure 3:
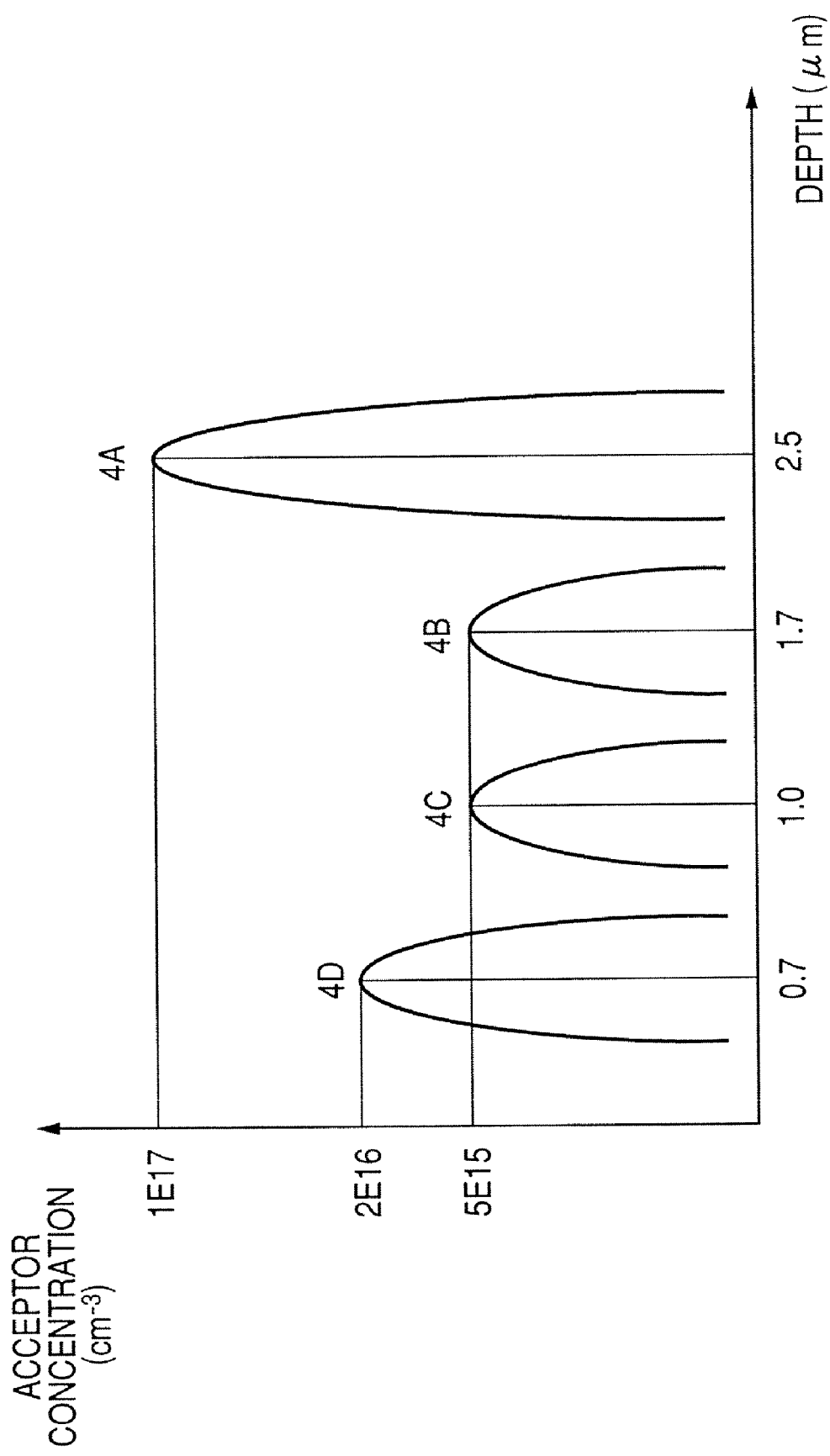
FIG. 3 is a diagram showing an impurity concentration profile in the first embodiment.

As shown in FIG. 3, a peak of the impurity concentration in the impurity region 4A is $1 \times 10^{16}$ cm$^{-3}$ to $1 \times 10^{18}$ cm$^{-3}$ and the depth at which the peak exists is 2.0 to 4.0 μm from the substrate surface. A peak of the impurity concentration in the impurity region 4B is $1 \times 10^{15}$ cm$^{-3}$ to $5 \times 10^{16}$ cm$^{-3}$ and the depth at which the peak exists is 1.2 to 2.5 μm from the substrate surface. A peak of the impurity concentration in the impurity region 4C is $1 \times 10^{15}$ cm$^{-3}$ to $5 \times 10^{16}$ cm$^{-3}$ and the depth at which the peak exists is 0.8 to 1.5 μm from the substrate surface. A peak of the impurity concentration in the impurity region 4D is $2 \times 10^{15}$ cm$^{-3}$ to $2 \times 10^{17}$ cm$^{-3}$ and the depth at which the peak exists is 0.5 to 1.0 μm from the substrate surface. A description of these ranges will be made below.

While this embodiment has been described with respect to a CMOS area sensor, the same effect of the present invention can also be achieved in the case of application to a CCD. In the case of application to a CCD, the floating diffusion region 10 is replaced with a VCCD.

The functions of the impurity regions 4A to 4D will be described. In the impurity regions 4B to 4D at shallower positions (closer to the substrate surface), an intermediary portion which conducts photocarriers to the pixel photodiode is formed. In the impurity region 4A at a deeper position, a potential peak which determines the spectral sensitivity is formed. The concentration in the impurity region 4A at the deepest position is set to a value higher, preferably, at least three times higher, more preferably, at least five times higher than the concentration in the impurity region 4B to form a potential barrier between the impurity regions 4A and 4B, thereby enabling carriers generated by incident light to be efficiently conducted to the photodiode without being lost in the direction of the substrate. In this way, the sensitivity can be increased. A condition for determination as to whether or not a potential barrier against thermal diffusion of electrons is formed is roughly expressed by the following equation:

$$Vb = (kT/q) \cdot \ln(N1/N2) < kT/q$$

In this equation, Vb is a barrier, k the Bolzman's constant, T the temperature, q the elementary charge, N1 the peak concentration of the barrier, and N2 the concentration at a position before the barrier. In the region indicated by the sign of inequality, electric charge can pass over the barrier by thermal excitation. That is, electric charge can pass over the barrier by thermal excitation when N1/N2<e (approximately equal to or smaller than 3).

Thus, a potential barrier exists when N1/N2 exceeds 3. Further, carriers passing over the potential barrier when N1/N2 exceeds 5 can be ignored.

The number of saturated electrons which can be held in the n-type charge accumulation region 8 can be controlled by controlling the concentrations in the impurity regions 4D and 4C and the depths of the impurity regions 4D and 4C. The relationship among the concentrations in the regions 4A to 4D is as described below. The peak C1 of the impurity concentration in the first impurity region (4A), the peak C2 of the impurity concentration in the second impurity region (4B, 4C) provided between the first impurity region and the substrate surface and the peak C3 of the impurity concentration in the third impurity region (4D) provided between the second impurity region and the substrate surface and formed adjacent to (abutting on) the second conduction type of impurity region forming the photodiode are set in a relationship C2<C3<C1. In this way, both an improvement in sensitivity resulting from the reduction in loss of electric charge in the direction of the substrate and an improvement in transfer efficiency can be achieved.

From the viewpoint of improving the sensitivity, it is preferable to form the well deeper, because the capacity of the impurity region capable of absorbing light is thereby increased. However, achieving this effect by increasing the number of times ion implantation is undesirable from the viewpoint of reducing the term of work. Then, the amounts of energy for ion implantation in the impurity regions 4A to 4D are set such that the regions 4E to 4G of the conduction type opposite to that of the well remain without any problem with the operation after being completely depleted by a built-in potential, thus enabling a plurality of impurity regions to be formed while the number of times ion implantation is minimized.

In this embodiment, the p-type well 4 constituted of a plurality of impurity regions has a four-layer structure having layers 4B to 4D for efficiently feeding electric charge to the charge accumulation region and the deepest well layer 4A. In this embodiment, however, the number of layers corresponding to the layers 4B to 4D in this embodiment is not limited to a particular number since the well depth should be determined according to the necessary sensitivity. If at least one intermediary well is formed, an improvement in sensitivity can be achieved. That is, it is preferred that the plurality of impurity regions include the first impurity region (4A) and the second impurity region (at least one of regions 4B, 4C and 4D) provided between the first impurity region and the substrate surface, and that a peak of the impurity concentration in the first impurity region be higher than a peak of the impurity concentration in the second impurity region.

There is no problem with a case where the n-type impurity regions 4E to 4G interposed between the plurality of p-type impurity regions do not exist. Also, there is no problem with a case where upper and lower p-type impurity regions are provided in a state of being spaced apart from each other and an n-type impurity region exists between the p-type impurity regions. In this case, however, it is necessary that the n-type impurity region interposed between the two p-type impurity regions be depleted.

Figure 2:
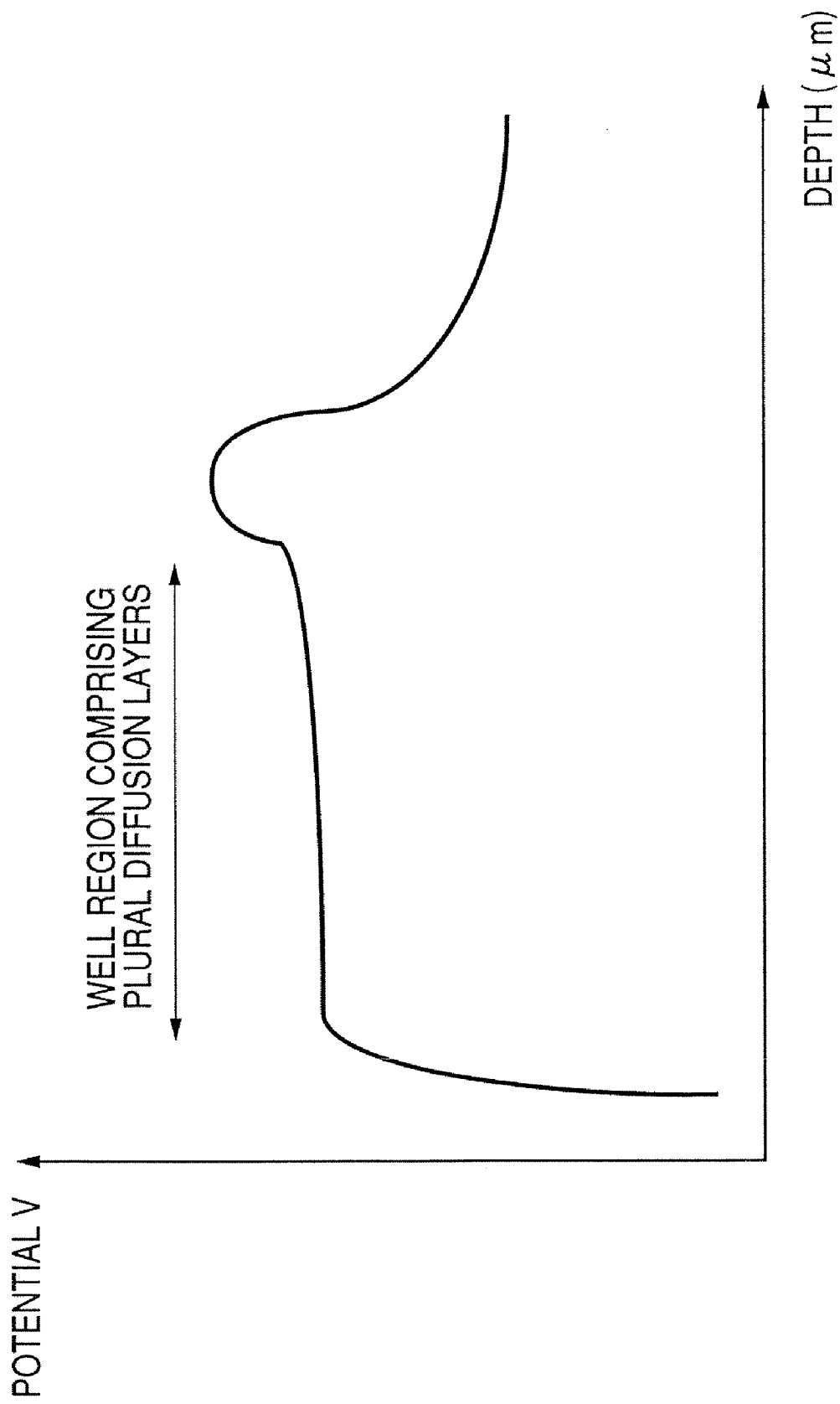
FIG. 2 is a diagram showing the potential in a well in a photodiode portion.

FIG. 2 is a diagram showing the potential in the well with respect to carriers which are electrons. There is no problem with an arrangement in which the plurality of p-type impurity regions do not abut on each other. In such a case, there is a need to deplete the n-type regions 4E to 4G between the p-type impurity regions so that the potential profile is generally flat, because, if the potential profile is not flat, the efficiency with which electrons generated at the deep well layer move to the electron accumulation region due to the potential barrier is reduced and, as a result, the sensitivity is reduced.

FIG. 3 shows the impurity profile of the p-type well forming the photodiode. In this embodiment, the p-type impurity regions 4A to 4D respectively have impurity concentration peaks and vary in their influence on the photodiode characteristics.

It is necessary to provide a potential peak in the impurity region 4A to improve the sensitivity. Therefore a peak of the impurity concentration in this region is necessary.

It is necessary to reduce a peak of the impurity concentration in the impurity region 4B relative to that in the impurity region 4A in order to form a potential barrier such as shown in FIG. 2. It is, therefore, necessary to set a peak of the impurity concentration in the impurity region 4B such that the impurity region 4A has the highest potential peak.

It is necessary to set the impurity concentration in the impurity region 4C such that it does not influence the impurity concentration profile in the impurity region 4D, and that the relationship between the regions 4A and 4B is maintained.

A placement of the impurity region 4D closer to the substrate surface in which the impurity region 4D abuts on the charge accumulation region of the photodiode suffices. It is possible to independently control the number of saturated electrons accumulable in the charge accumulation region and the characteristic of transfer from the charge accumulation region to floating diffusion by using the impurity region 4D.

The positions of the peaks of the concentrations in the impurity regions are not limited to those described above. In particular, the region 4D may be formed so as to cover the n-type impurity region 8 at a lower position (deeper in the substrate depth direction).

Figure 4:
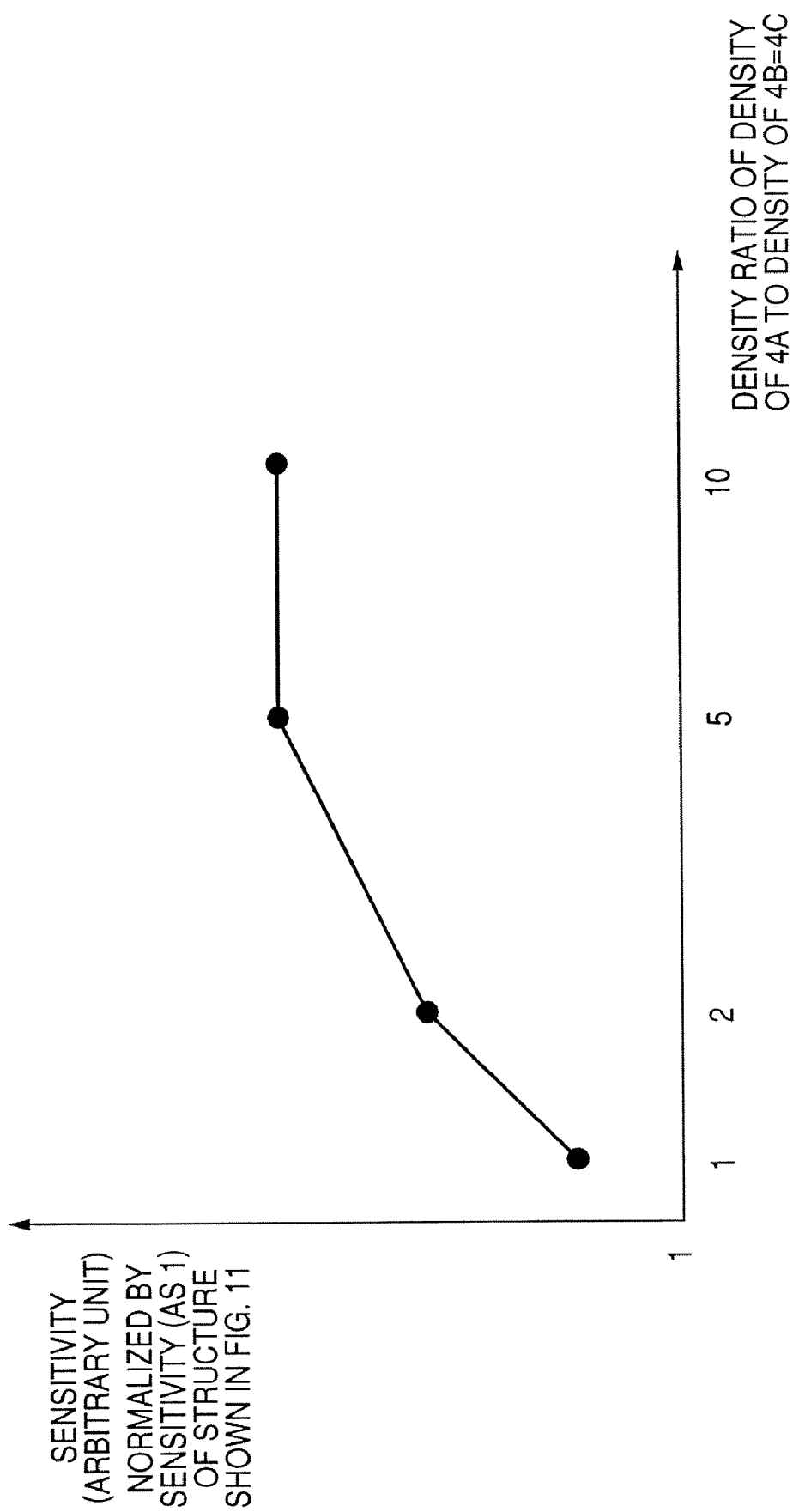
FIG. 4 is a characteristic diagram showing the relationship between the sensitivity and the ratio of the concentration in a diffusion layer 4A and the concentrations in diffusion layers 4B and 4C.

Description will be made of the relationship between the peak concentration in the region 4A and the peak concentrations in the regions 4B and 4C positioned between the region 4A and the substrate surface. FIG. 4 shows the relationship between the peak impurity concentration in the impurity region 4A and the peak impurity concentrations in the impurity regions 4B and 4C when the peak concentrations in the impurity regions 4B and 4C are equal to each other. The ranges of the above-described impurity concentrations and the depths of the peaks are determined under these conditions.

If (concentration in 4A)/(concentration in 4B) is larger than 1, a significant improvement in sensitivity is recognized. If (concentration in 4A)/(concentration in 4B) is equal to or larger than 2, a further improvement in sensitivity is obtained. If (concentration in 4A)/(concentration in 4B) is equal to or larger than 5, a satisfactory improvement in sensitivity is recognized.

Figure 5:
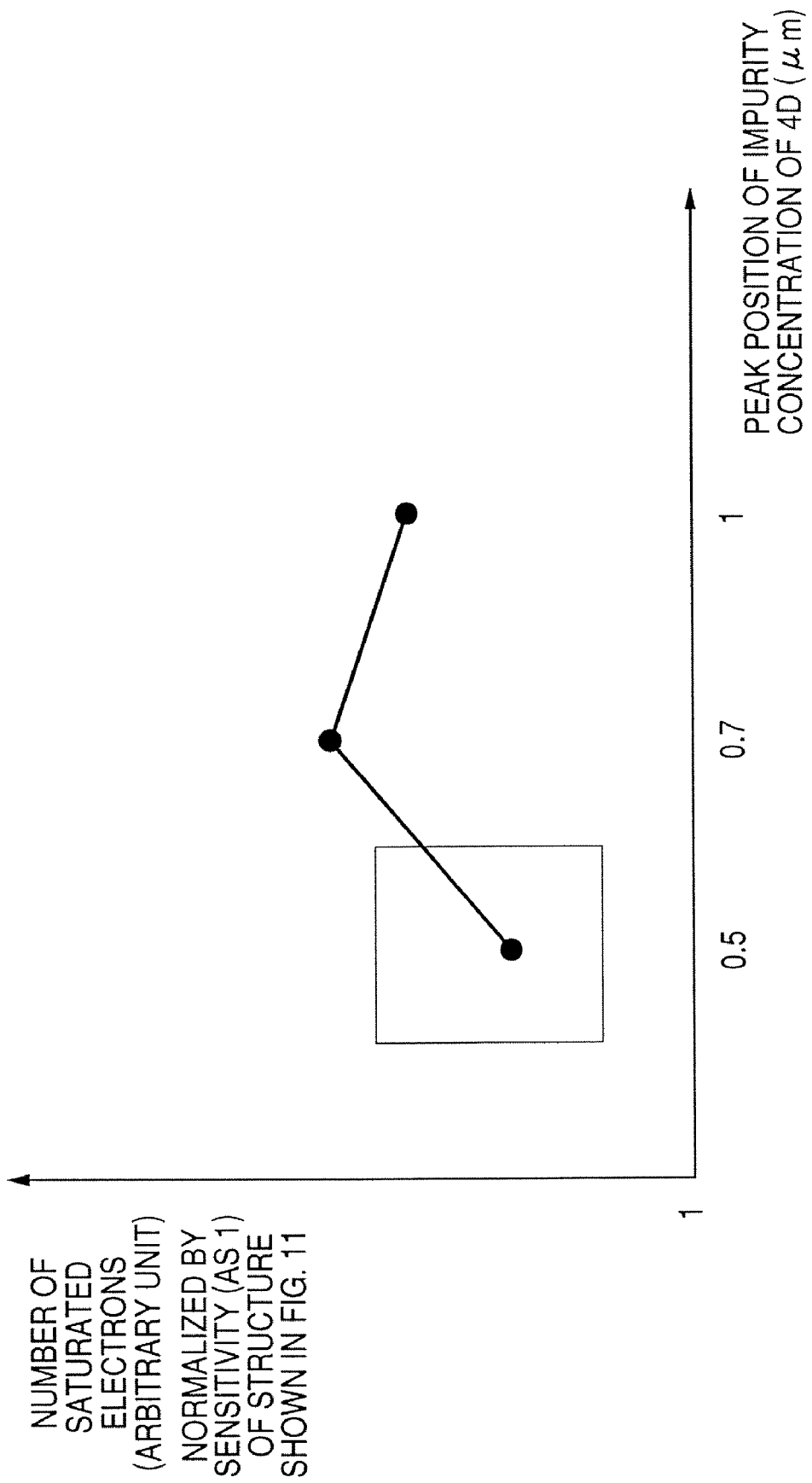
FIG. 5 is a characteristic diagram showing the relationship between the concentration peak position in a diffusion layer 4D and the number of saturated electrons.
Figure 11:
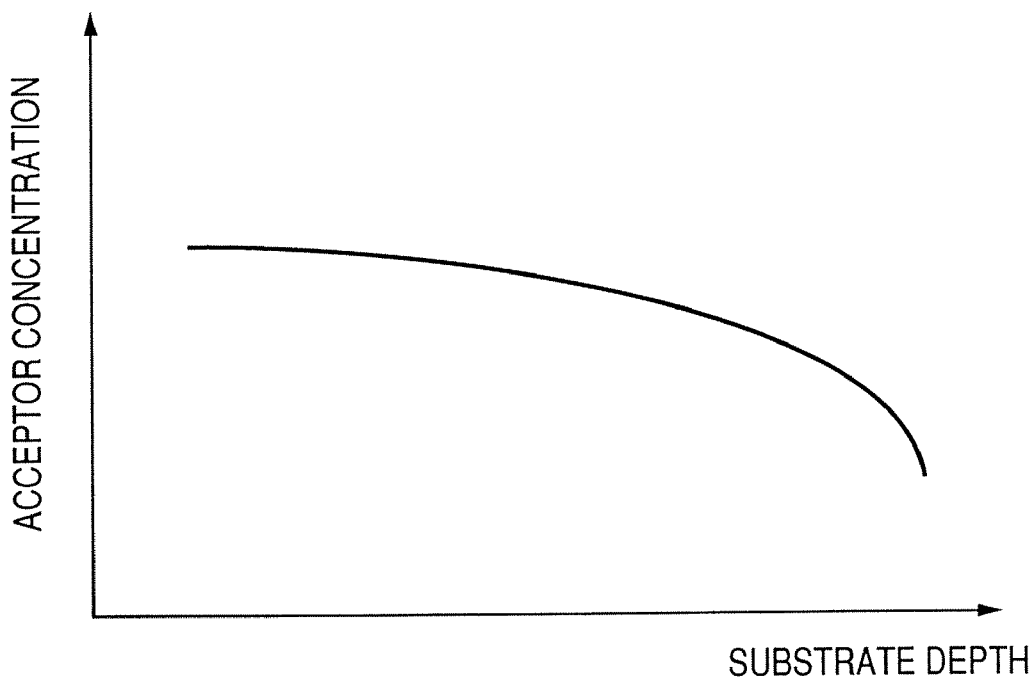
FIG. 11 is a diagram schematically showing a p-type well concentration distribution in the conventional art.

Description will be made of the position of the peak in the region 4D adjacent to the impurity region 8. FIG. 5 is shows the relationship between the depth of the impurity concentration peak in the impurity region 4D and the number of saturated electrons. It can be understood from FIG. 5 that the diffusion layer in the impurity region 4D has a certain optimum range of depth. To be more specific, an improvement in sensitivity can be achieved in comparison with the arrangement shown in FIG. 11 if the depth is in the range from 0.5 to 1.0 μm.

Figure 6:
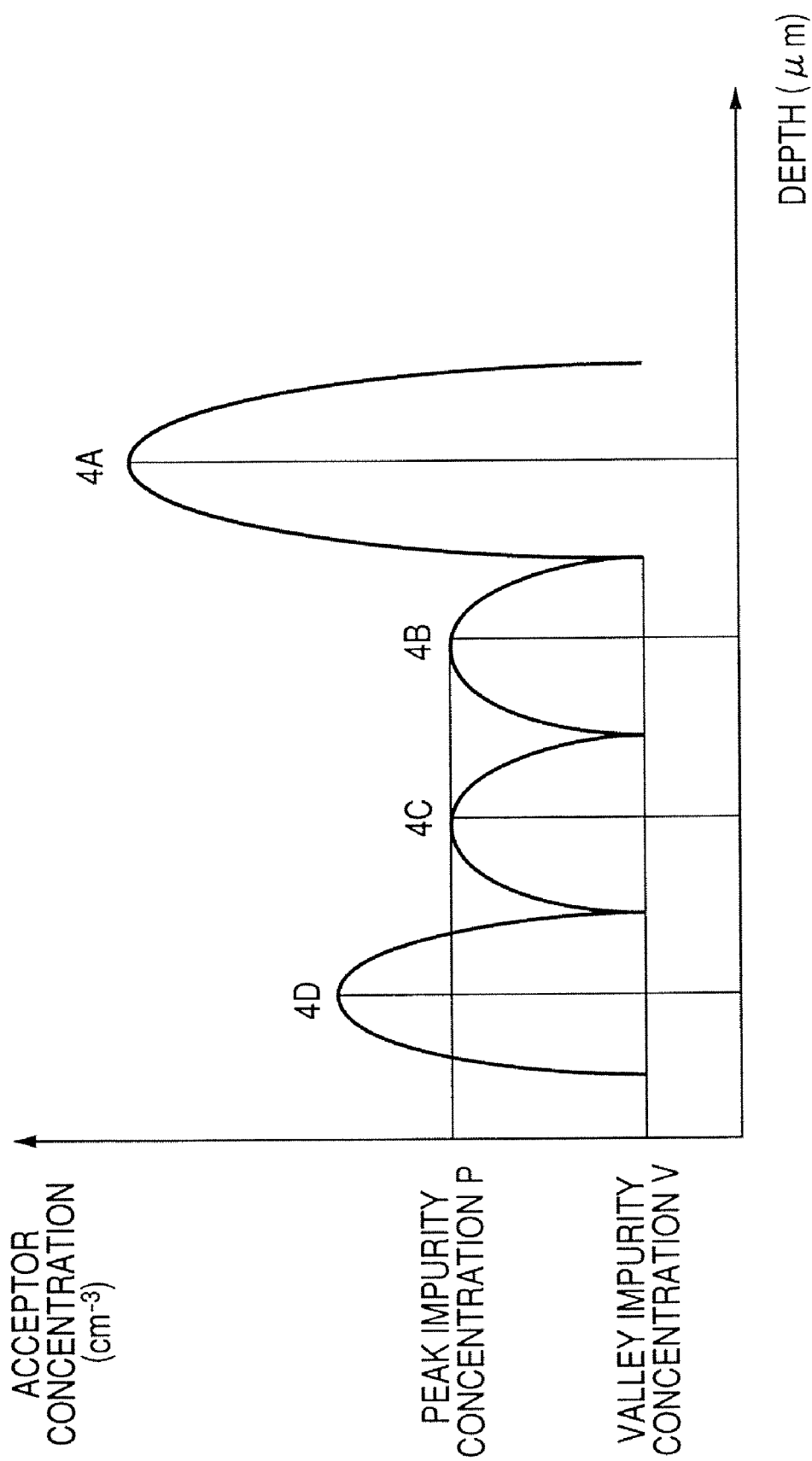
FIG. 6 is a diagram for explaining an impurity concentration profile in the first embodiment.
Figure 7:
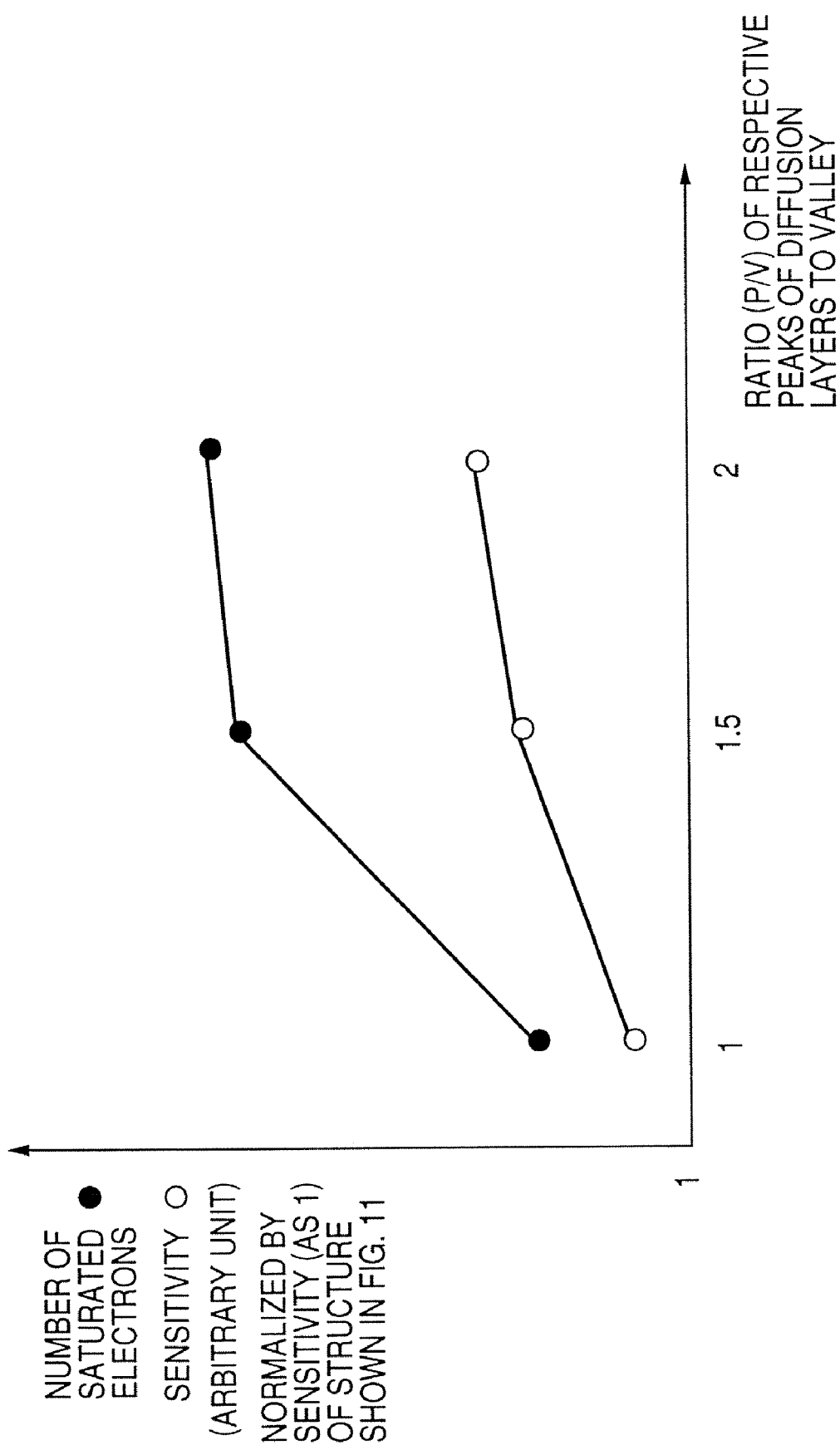
FIG. 7 is a diagram showing the relationship between the peak-valley ratio of the diffusion layers and the number of saturated electrons.

FIG. 6 shows the profile of the impurity concentration in the p-type well constituted of the plurality of impurity regions, and FIG. 7 shows the relationships between the concentration profile, the number of saturated electrons and the sensitivity. If a flat impurity concentration profile is formed by performing a high-temperature heat treatment on the impurity regions having impurity concentration peaks (if the ratio P/V of the diffusion layers becomes closer to 1), each of the characteristics in terms of the number of saturated electrons and the sensitivity degrades. This is because the ratio of the impurity concentration peak in the impurity region provided at a deep position in the substrate and the impurity concentrations in the impurity regions at shallower positions becomes lower, and because the peak positions in the impurity concentration profiles of the impurity regions at the shallower positions become indefinite.

Thus, it is possible to manufacture a photoelectric conversion device satisfying both a condition in terms of improvement in sensitivity and a condition in terms of increase in the number of saturated electrons by forming a photodiode in a well containing a plurality of impurity regions having impurity concentration peaks.

A manufacturing process will be described with reference to the cross-sectional view of FIG. 1.

Field oxide film 5 is formed on the substrate 3 made of silicon by an ordinary LOCOS (local oxidation of silicon) separation method, a recess LOCOS method or the like. A channel stop layer 6 is formed under the field oxide film 5. Thereafter, the p-type well 4 constituted of a plurality of impurity regions is formed in such a manner that ion implantation of a p-type impurity (e.g., boron) is performed four times by using high-energy ion implantation apparatus to implant the impurity from the deepest position to the shallowest position, not followed by a high-temperature heat treatment such as drive-in. The temperature of a heat treatment thereafter performed is about 950° C. at the maximum. Since thermal diffusion is not performed for this p-type well 4, the facility with which the concentrations is controlled in each the impurity region is improved. The potential in the upper-layer impurity regions 4B to 4D can be limited by setting the concentrations in these regions to lower values, thus making it easier to improve the sensitivity as well as to form a potential difference from the impurity region 4A. After the formation of the polysilicon electrode 7, the impurity region 8 to be provided as the n-type charge accumulation region of the photodiode, the impurity region 9 to be provided as a p-type surface layer and the n-type impurity region 10 to be provided as floating diffusion are formed by ion implantation.

The manufacturing process after the step of forming the contact opening is the same as that for the conventional CMOS area sensor, and will not be described in this specification.

As described above, the first conduction type of impurity region of a photodiode forming a photoelectric conversion element is formed by a plurality of impurity regions having impurity concentration peaks, and the peak C1 of the impurity concentration in the first impurity region, the peak C2 of the impurity concentration in the second impurity region provided between the first impurity region and the substrate surface and the peak C3 of the impurity concentration in the third impurity region provided between the second impurity region and the substrate surface and formed adjacent to (abutting on) the second conduction type of impurity region forming the photodiode are set in a relationship C2<C3<C1, thereby enabling absorbed photocarriers to be efficiently conducted to the photodiode without being lost in the direction of the substrate, and making it possible to improve the sensitivity as well as to improve the efficiency of transfer from the charge accumulation region to floating diffusion (readout region).

Second Embodiment

Figure 8:
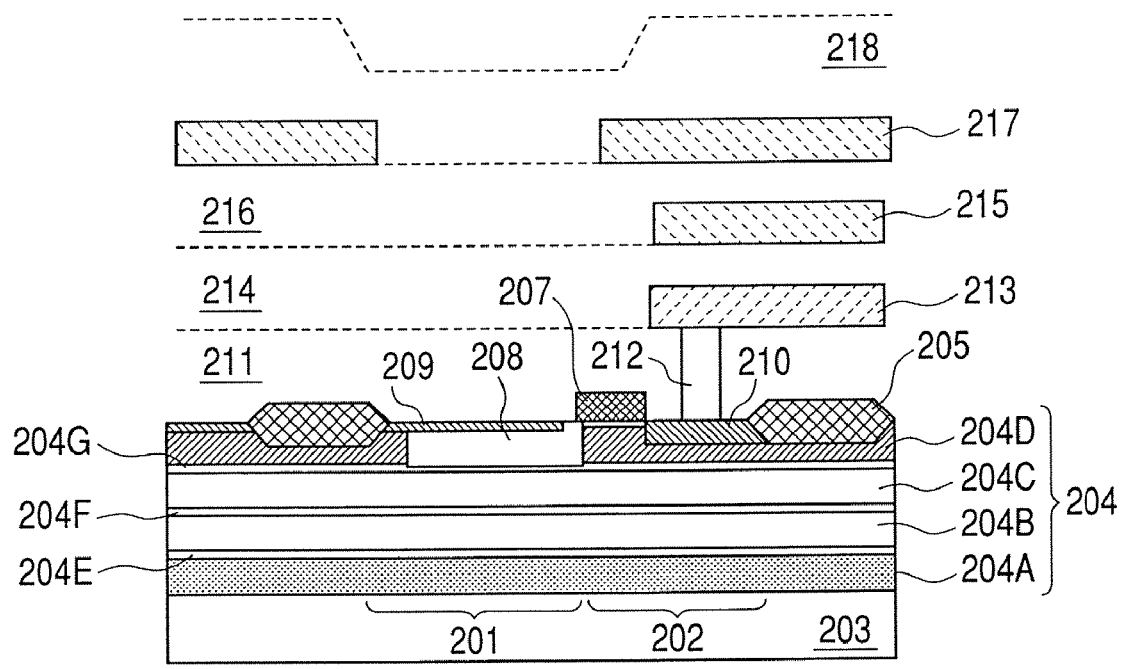
FIG. 8 is a cross-sectional view of a photoelectric conversion device in a second embodiment of the present invention.
Figure 9:
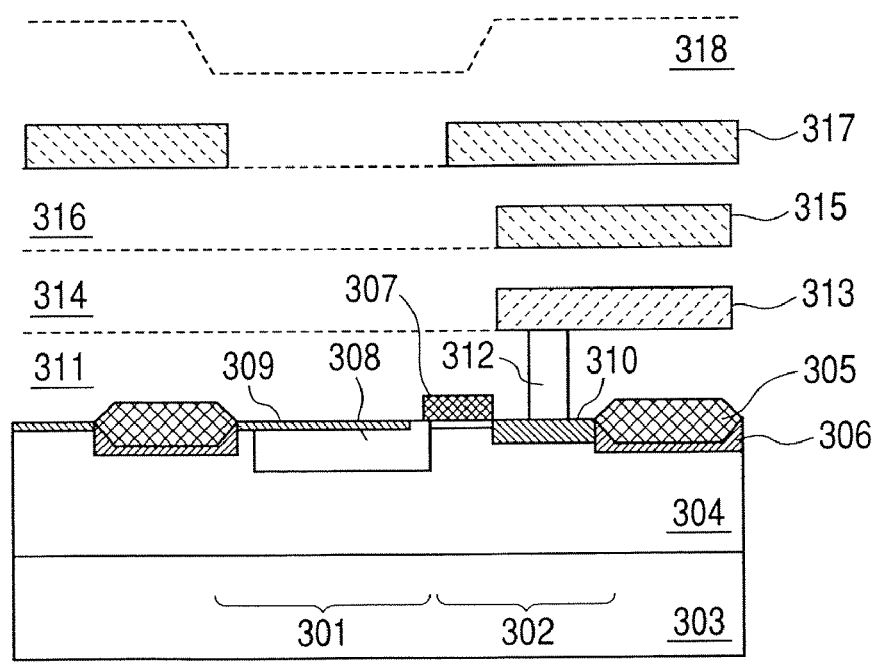
FIG. 9 is a cross-sectional view of a conventional CMOS area sensor.
Figure 10:
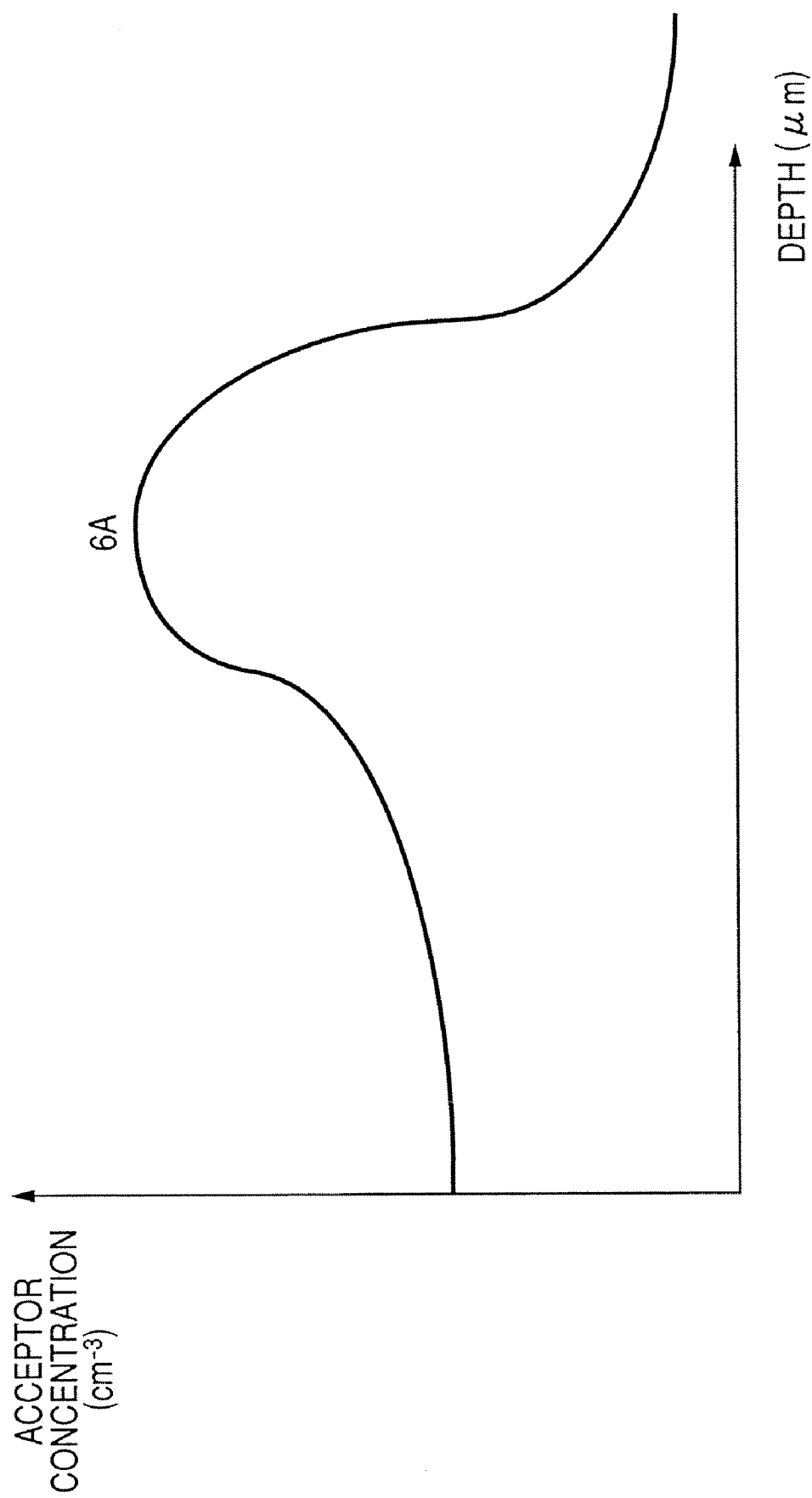
FIG. 10 is a diagram schematically showing a p-type well concentration distribution in the conventional art.

FIG. 8 is a schematic cross-sectional view of a second embodiment of the present invention. The second embodiment differs from the first embodiment in that a well 204 constituted of a plurality of p-type impurity regions is formed so as to extend continuously to a position below an element-separating field oxide film 205 and to adjacent pixel-forming portions, and no channel stop region for element separation exists under the field oxide film. An impurity region 204D in the p-type well 204 including a plurality of impurity regions also has the function of element separation between adjacent pixel-forming portions to enable ion implantation necessary for element separation and forming of the impurity regions forming the well to be performed simultaneously with each other. The number of process steps and the number of masks are thereby reduced. If the concentrations in regions 204C and 204B provided at positions deeper than the position of the impurity region 204D are reduced and if the concentration in an impurity region 204A is set higher, preferably at least two times higher, more preferably, at least five times higher than those in the regions 204C and 204B, an improvement in sensitivity, equivalent to that in the first embodiment, can be obtained, while the element separation characteristics are maintained.

Third Embodiment

Figure 12:
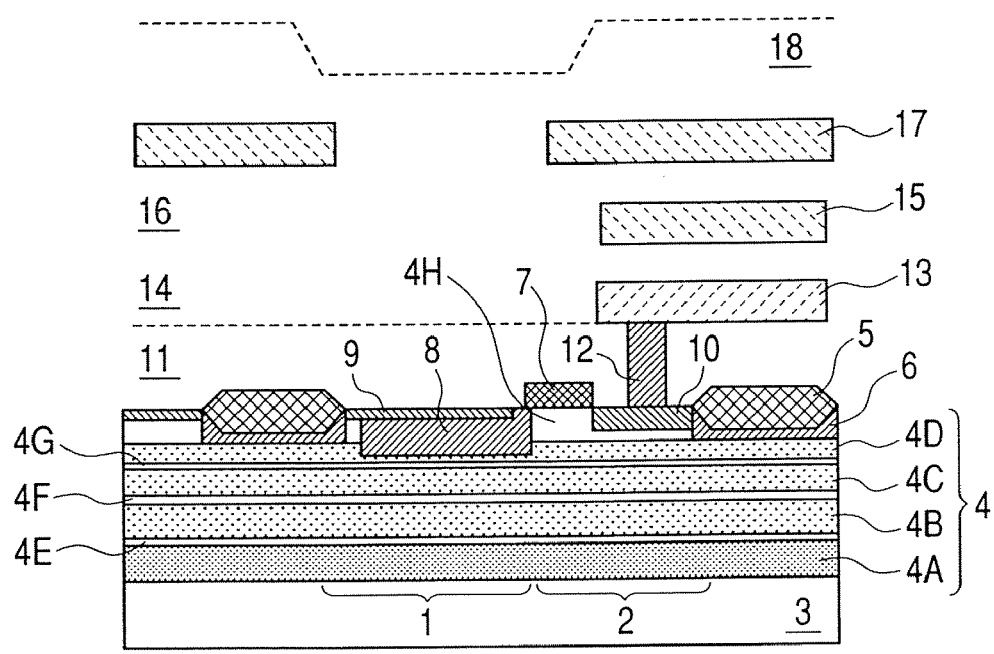
FIG. 12 is a cross-sectional view of a photoelectric conversion device in a third embodiment of the present invention.
Figure 13:
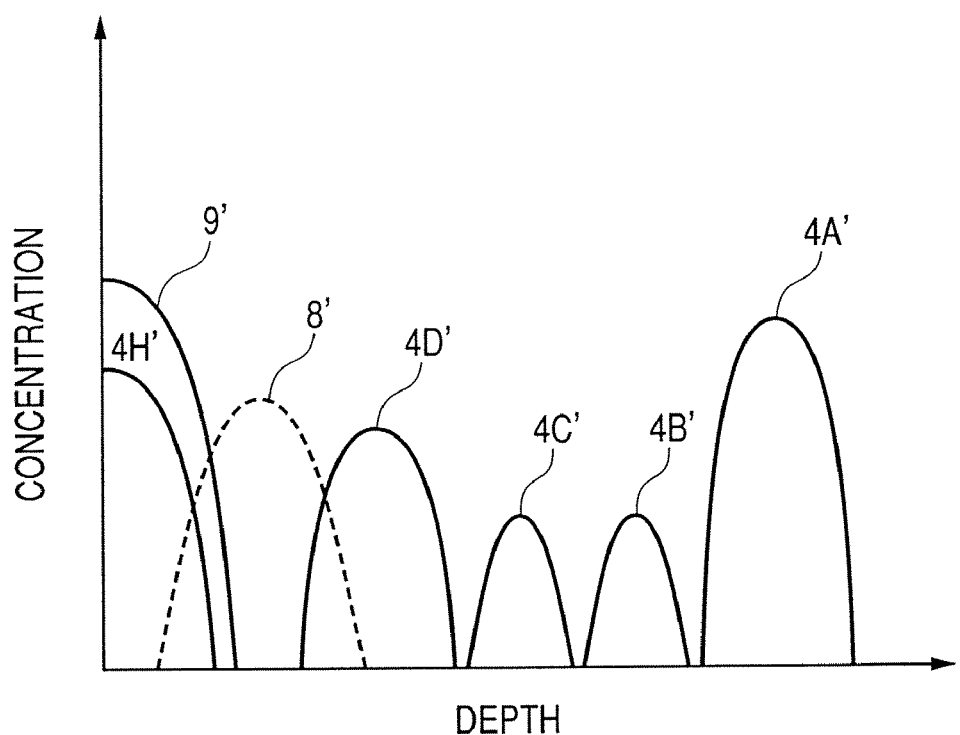
FIG. 13 is a diagram showing an impurity profile of the photodiode portion of the photoelectric conversion device in the third embodiment.

FIG. 12 is a schematic cross-sectional view of a third embodiment of the present invention, and FIG. 13 is a diagram schematically showing the impurity profile of the photodiode portion in the third embodiment. In the third embodiment, the charge accumulation region having the function of accumulating electric charge is formed in a state of being embedded in a part of the region 4D adjacent to the charge accumulation region. This formation ensures that the extent of the depletion layer is suitably limited within the region 4D.

Also, a p-type impurity region indicated by 4H in FIG. 12 is formed by forming the p-type impurity region 4D continuously with a region formed as a channel dope layer in the channel portion under the gate of the transfer MOS transistor. The region 4H is necessary for enabling the transfer MOS transistor to operate normally. It is important to form the region 4H so that no n-type impurity region exists. Concrete description will be made of this with reference to the impurity profile in FIG. 13. A region 4A' corresponds to the p-type impurity region 4A, a region 4B' the p-type impurity region 4B, a region 4C' the p-type impurity region 4C, a region 4D' the p-type impurity region 4D, a region 8' the n-type impurity region 8, a region 9' the p-type impurity region 9, and a region 4H' the p-type impurity region 4H. A structure is adopted such that the conditions for formation of the channel dope region 4H' and the p-type impurity region 4D are adjusted so that no n-type impurity region is formed under the transfer MOS transistor. If such a structure is used, an improvement in sensitivity, equivalent to that in the above-described embodiments and an improvement in the transfer efficiency of the transfer MOS transistor can be achieved.

Fourth Embodiment

A fourth embodiment will be described regarding a peak of the impurity concentration in the impurity region adjacent to the charge accumulation region in particular. A reduction in the impurity concentration in the region adjacent to the charge accumulation region leads to occurrence of a disadvantage relating to a characteristic other than the sensitivity because of a factor in the structure of the photodiode. Since the concentration in the well immediately below the charge accumulation portion of the photodiode is reduced, a problem arises that the depletion voltage is increased when the charge accumulation portion is sufficiently reset by depletion, particularly when the charge accumulation portion is completely deleted. Further detailed description will be made of this point.

As a method of removing reset noise of a photodiode, a reset operation which causes complete depletion in a photodiode at the time of reset and at the time of charge readout, and which is particularly effective in reducing noise, has become actually practical. For implementation of this method, setting the voltage for sufficiently (preferably, completely) depleting the photodiode lower than the reset voltage and sufficient charge transfer within the restricted range of the transfer gate on voltage are required. Also from the viewpoint of the facility with which this charge transfer is performed, it is necessary to design depletion voltage of the photodiode as low as possible. On the other hand, it is desirable to increase the concentration in the change accumulation region of the photodiode in order to ensure a sufficient dynamic range, i.e., a sufficiently large number of saturated electrons in the photodiode. Therefore, the method of reducing the concentration in the charge accumulation region is considered not preferable from the viewpoint of maintaining the desired dynamic range, although it is effective in reducing the depletion voltage.

Consequently, a solid-state image pickup element satisfying both the requirement for the charge transfer facility and the requirement for maintenance of the dynamic range is in demand.

In this embodiment, therefore, the photodiode is formed so as to include at least the second conduction type of well and the first conduction type of impurity region (charge accumulation region) formed in the first conduction type of semiconductor substrate; the well includes a plurality of impurity regions having impurity concentration peaks; and a peak of the impurity concentration in the impurity region adjacent to the charge accumulation region is set in the range from $3 \times 10^{15}$ to $2 \times 10^{17}$ cm$^{-3}$.

Thus, a design is made in which the peak of the impurity concentration in the impurity region adjacent to the charge accumulation region (the first impurity concentration peak) is higher than that in the conventional arrangement, thereby limiting the extent of the deletion layer extending on the well side. Consequently, it is possible to maintain the saturated charge while reducing the deletion voltage of the photodiode.

More specifically, in the above-mentioned carrier profile described in U.S. Pat. No. 6,483,129, the concentration in the region provided below the accumulation region in the vicinity of the surface of the well adjacent to the accumulation region is about $1 \times 10^{15}$ cm$^{-3}$. In this case, the deletion layer extends on the well side by about 1 μm. According to a measurement actually made by the inventors of the present invention, the unnecessary deletion voltage required in this case without any contribution to the saturated charge is about 1 V. In contrast, in this embodiment, the concentration in the impurity region below the accumulation region is specified to largely reduce the deletion voltage. The impurity region in which the impurity concentration is specified corresponds to the region placed adjacent to the charge accumulation region at a position at which the deletion layer is formed.

Further, it is preferred that a peak of the impurity concentration (third impurity concentration peak) in an intermediate region 109 formed under this impurity region (in the direction of depth of the substrate) be ¼ or higher of the peak of the impurity concentration in the impurity region adjacent to the charge accumulation region, and be ⅓ or lower of a peak of the impurity concentration (second impurity concentration peak) in an impurity region 110 placed at a deeper position. Such an arrangement enables carriers which are lost in the direction of the substrate in the conventional arrangement to be taken in as a signal charge, thus improving the quantization efficiency further preferably.

The present invention can be suitably used for a pixel-forming structure using an amplification device for amplifying a photoelectrically converted charge in a pixel-forming portion.

Figure 14:
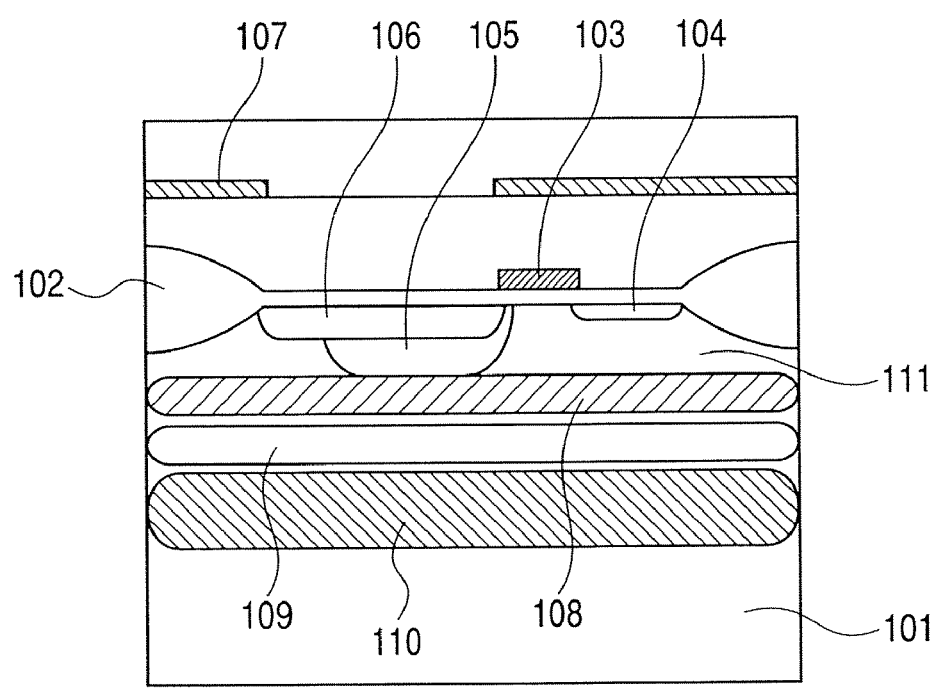
FIG. 14 is a cross-sectional view of a fourth embodiment of the present invention.

FIG. 14 is a cross-sectional view of this embodiment. An n-type silicon substrate (semiconductor substrate) 101 is provided. A p-type well including impurity regions 108 to 110 having impurity concentration peaks is formed in the n-type silicon substrate 101. At the substrate surface are formed a device separation region 102, a gate electrode 103 of a transfer transistor, an n-type impurity region 104 in which floating diffusion is formed, an n-type impurity region 105 which is the charge accumulation region of the photodiode, a surface p-type impurity region 106 of the photodiode, and a p-type impurity region 111 for providing a channel for the transfer MOS transistor. An opening is formed in a light shielding layer 107 which blocks light traveling toward regions other than the photodiode. In FIG. 14, wiring layers other than the light shielding layer are not shown. In FIG. 14, the p-type impurity region in which a well is formed is shown in a state of being divided into three regions in correspondence with different purposes. Referring to FIG. 14, at a position closer to the surface, the p-type impurity region 108 having the first impurity concentration peak is placed below and adjacent to the accumulation region 105 of the photodiode. The impurity region 108 has the function of limiting the width of the depletion layer at the junction between the impurity region 108 and the accumulation region (n-type impurity region) 105 of the photodiode. Because of this effect, the depletion voltage of the photodiode can be reduced. The photodiode can be reset without increasing the voltage for resetting the impurity region 104. Thus, an improvement in transfer efficiency, more preferably complete transfer can be achieved.

Also, the transfer gate voltage necessary for reset of the photodiode and transfer, i.e., the on-voltage applied to the gate electrode 103 of the transfer transistor, can be reduced to ensure the desired dynamic range without increasing the power supply voltage.

Also, the impurity region 110 placed at a position deeper than the position of the impurity region 108 and having the second impurity concentration peak can be formed by ion implantation of boron for example. If boron is implanted at an energy of 2 MeV, the impurity region 110 can be formed at a depth of 3 μm from the silicon surface. Photocarriers generated at a position deeper than the place in which the impurity concentration peak is formed in the impurity region 110 are lost in the silicon substrate. However, photocarriers generated in a portion closer to the silicon surface relative to the impurity region 110 can be collected on the photodiode side. The impurity region 109 placed at an intermediate position is formed so as to have a concentration lower than that in the impurity region 110 in order to diffuse photocarriers generated in the vicinity of the impurity region 110 to the surface side.

Figure 15:
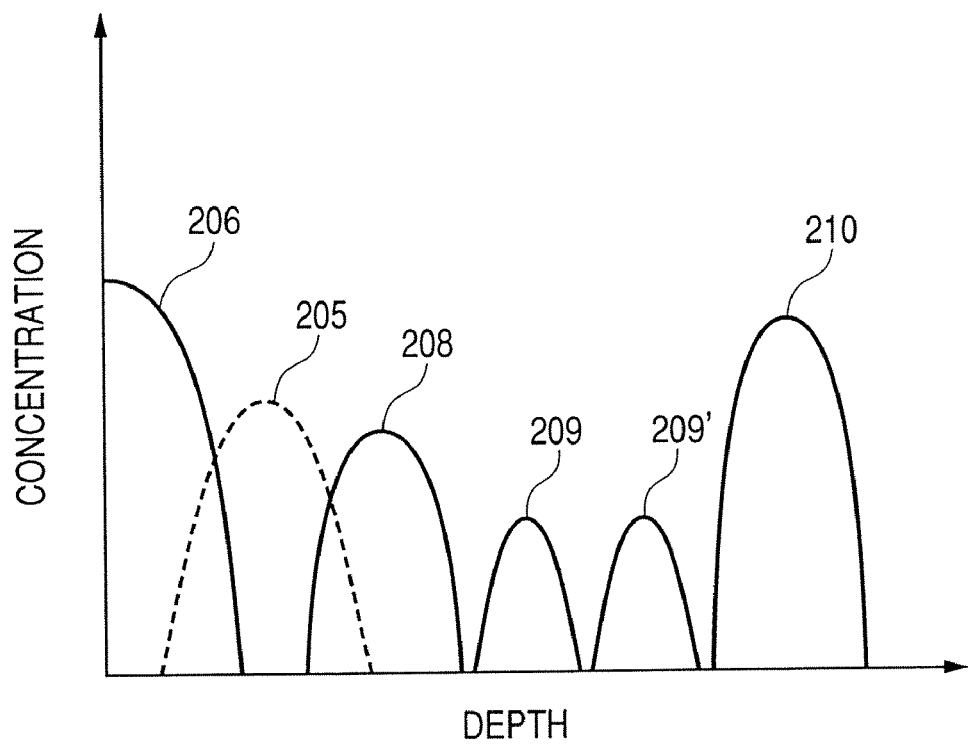
FIG. 15 is a diagram schematically showing a concentration profile in the fourth embodiment.

FIG. 15 is a diagram for explaining the concentration profile in the vertical direction in the photodiode portion. The surface p-type impurity region 106 in the photodiode shown in FIG. 14 has a concentration profile 206, which can be formed by implantation of boron or boron fluoride. The accumulation region 105 of the photodiode shown in FIG. 14 has a concentration profile 205, which can be formed by implantation of phosphorous or arsenic. The p-type impurity region 108 adjacent to the accumulation region 205 as shown in FIG. 14 has a concentration profile 208. The intermediate region 109 shown in FIG. 14 has concentration profiles 209 and 209'. Referring to FIG. 15, the intermediate region 109 is formed so as to have two peaks. It is also effective to form concentration profiles by a plurality of ion implantation steps according to the desired structure in this manner. The profiles 209 and 209' can be formed by performing implantation of boron or boron fluoride two times at different acceleration energy levels. The impurity region 110 shown in FIG. 14 has a concentration profile 210 formed at a position deeper than the positions of the profiles 208 and 209. The profile in the region 111 is not shown in FIG. 15.

Means for achieving both an improvement in sensitivity and an increase in the number of saturated electrons will be described in detail.

A condition for determination as to whether or not a potential barrier against thermal diffusion of electrons is formed is roughly expressed by the following equation:

$$Vb=(kT/q)\cdot\ln(N1/N2)<kT/q$$

In this equation, Vb is a barrier, k the Bolzman's constant, T the temperature, q the elementary charge, N1 the peak concentration of the barrier, and N2 the concentration at a position before the barrier. In the region indicated by the sign of inequality, electric charge can pass over the barrier by thermal excitation. That is, electric charge can pass over the barrier by thermal excitation when N1/N2<e (approximately equal to or smaller than 3). In this embodiment, therefore, an arrangement is further preferable in which the potential formed in the well region 108 adjacent to the accumulation region 105 does not act as a barrier, while the potential formed in the region 110 functions as a barrier. More specifically, according to the above description, (1) the peak of the impurity concentration in the profile 210 of the impurity region is at least three times higher than the peak concentrations in the profiles 209 and 209' of the intermediate region 109, and (2) the peak concentration in the profile 208 of the impurity region 108 adjacent to the accumulation region 205 is equal to or smaller than the value four times higher than the peak concentrations in the profiles 209 and 209' of the intermediate region 109.

The reason for limitation to the value four time higher as described in (2) is that since the concentrations in the accumulation region 205 and the well region 108 adjacent to the accumulation region 205 are in such a relationship as to cancel out each other as net concentrations, the concentration about four times higher, considered as the well (boron) concentration only, is lower in terms of effective net concentration in actuality. The following is a concrete example of the concentration relationship satisfying such conditions. Since the peak concentration in the impurity region 108 adjacent to the accumulation region 205 is $3\times10^{15}$ to $2\times10^{17}$ cm$^{-3}$ as mentioned above, it is effective to set the peak concentrations in the profiles 209 and 209' in the intermediate region 109 to $1\times10^{15}$ to $5\times10^{16}$ cm$^{-3}$ and the peak concentration in the impurity region 110 to $3\times10^{15}$ to $1\times10^{18}$ cm$^{-3}$.

Means for limiting the depletion voltage of the photodiode will be described in detail. It is important to limit the extent of the depletion layer within the adjacent impurity region 108 according to an ideal design in this embodiment. Considering that electric force lines which originate from positive fixed charges terminate at negative fixed charges in the depletion layer, the total number of fixed charges in the accumulation region 105 is equal to the sum of the number of fixed charges in the depletion layer in the surface p-type impurity region 106 and the number of fixed charges in the depletion layer in the adjacent p-type impurity region 108.

Considering that the peak concentration in the surface p-type impurity region 106 is higher than that in the p-type impurity region 108, the surface p-type impurity region 106 can have the majority of the number of fixed charges, and the peak concentration in the adjacent impurity region 108 can be a solution even when it is equal to or lower than ½ of that in the accumulation region 105. According to an experiment and study made by the inventors of the present invention, the effects of this embodiment can be obtained when the peak concentration in the accumulation region 105 is as defined by $3 \times 10^{16} <$ the peak concentration in the accumulation region $105 < 8 \times 10^{17}$ cm$^{-3}$, and when the peak concentration in the adjacent impurity region 108 is as defined by $3 \times 10^{15}$ cm$^{-3} <$ the peak concentration in the accumulation region $108 <$ the peak concentration in the accumulation region 105. More preferably, the peak concentration in the adjacent impurity region 108 is equal to or higher than ¼ of the peak concentration in the accumulation region 105. In this case, the effects are enhanced. Further preferably, the peak concentration in the accumulation region 105 is as defined by $5 \times 10^{16} <$ the peak concentration in the accumulation region $105 < 2 \times 10^{17}$ cm$^{-3}$, and the peak concentration in the adjacent impurity region 108 is as defined by $1 \times 10^{16}$ cm$^{-3} <$ the peak concentration in the accumulation region $108 <$ the peak concentration in the accumulation region 105, that is, the upper limit is set equal to the concentration in the accumulation region.

Also, it is effective to set the depths of the concentration peaks in a relationship shown below. If the depth of the concentration peak in the accumulation region is V1 and if the depth of the concentration peak in the adjacent impurity region 108 is V2, $V1 < V2 < 2 \times V1$. In this case, the effects of this embodiment can be obtained further effectively.

Fifth Embodiment

Figure 16:
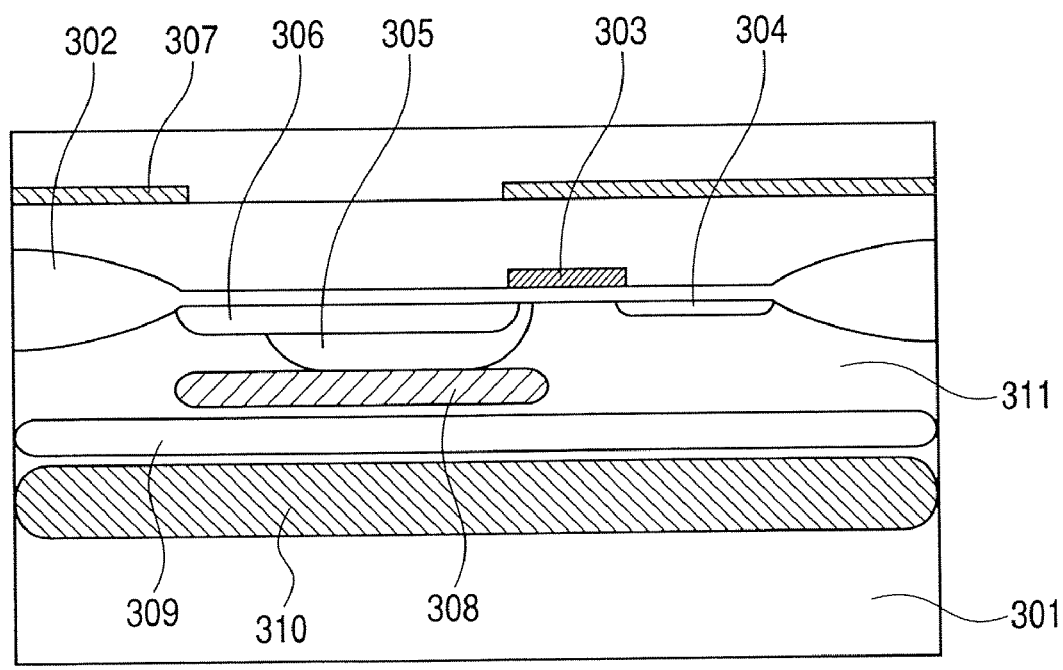
FIG. 16 is a cross-sectional view of a fifth embodiment of the present invention.

FIG. 16 is a diagram for explaining a firth embodiment of the present invention. 301 to 311 in FIG. 16 respectively correspond to 101 to 111 in FIG. 14. In this embodiment, an impurity region 308 adjacent to an accumulation region 305 in a photodiode is not formed over the entire pixel-forming area but only formed below the accumulation region 305. This structure has advantages described below.

(1) (Structural Advantages)

The effect of preventing blooming, smear and color mixing is obtained because a charge overflowing from the adjacent pixel-forming portion can be absorbed in the readout region 304. The influence of the region 308 concentration design on the characteristics of the transistor in the pixel-forming region and a transistor outside the pixel-forming region (not shown) is reduced, so that the design freedom is improved. The readout region junction capacity is reduced to increase the gain. The S/N ratio is thereby improved.

(2) (Process Advantages)

The adjacent p-type impurity region 308 can be formed by using the same photoresist as that for the accumulation region 305 or the surface p-type impurity region 306. In principle, it is also possible to form the p-type impurity region 310 by using the same resist. However, it is necessary for a resist to be formed thick if it is used as a resist capable of maintaining the blocking performance under deeper ion implantation, and it is not easy to form such a resist in a fine pattern. The impurity region 310 can be formed by an epitaxial method. In such a case, the p-type impurity region 308 adjacent to the accumulation region 305 may be formed by using the same photoresist as that for the accumulation region 305 or the surface p-type impurity region 306, thus obtaining the effects of this embodiment without increasing the number of process steps.

Sixth Embodiment

Figure 17:
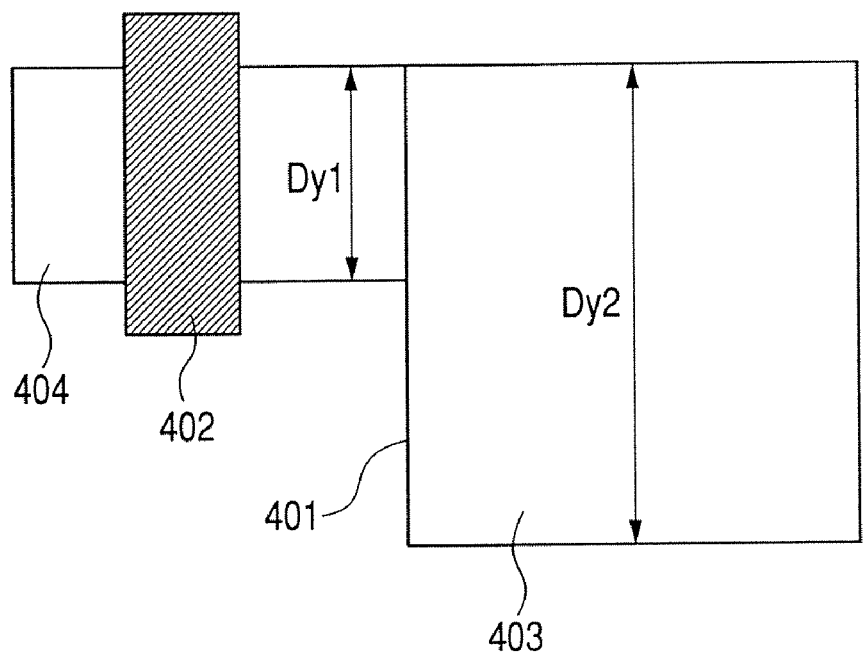
FIG. 17 is a top view of a sixth embodiment of the present invention.
Figure 18:
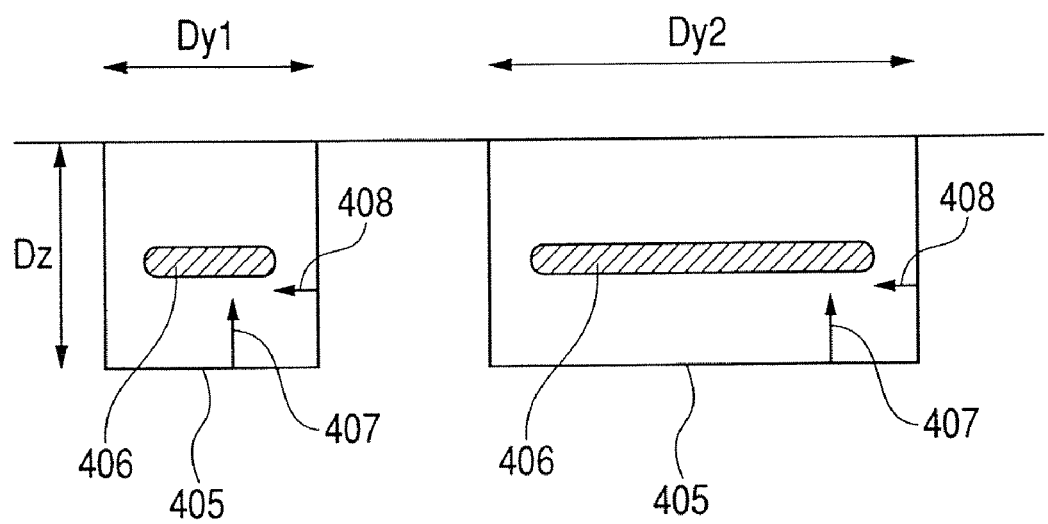
FIG. 18 is a cross-sectional view of the sixth embodiment of the present invention.
Figure 19:
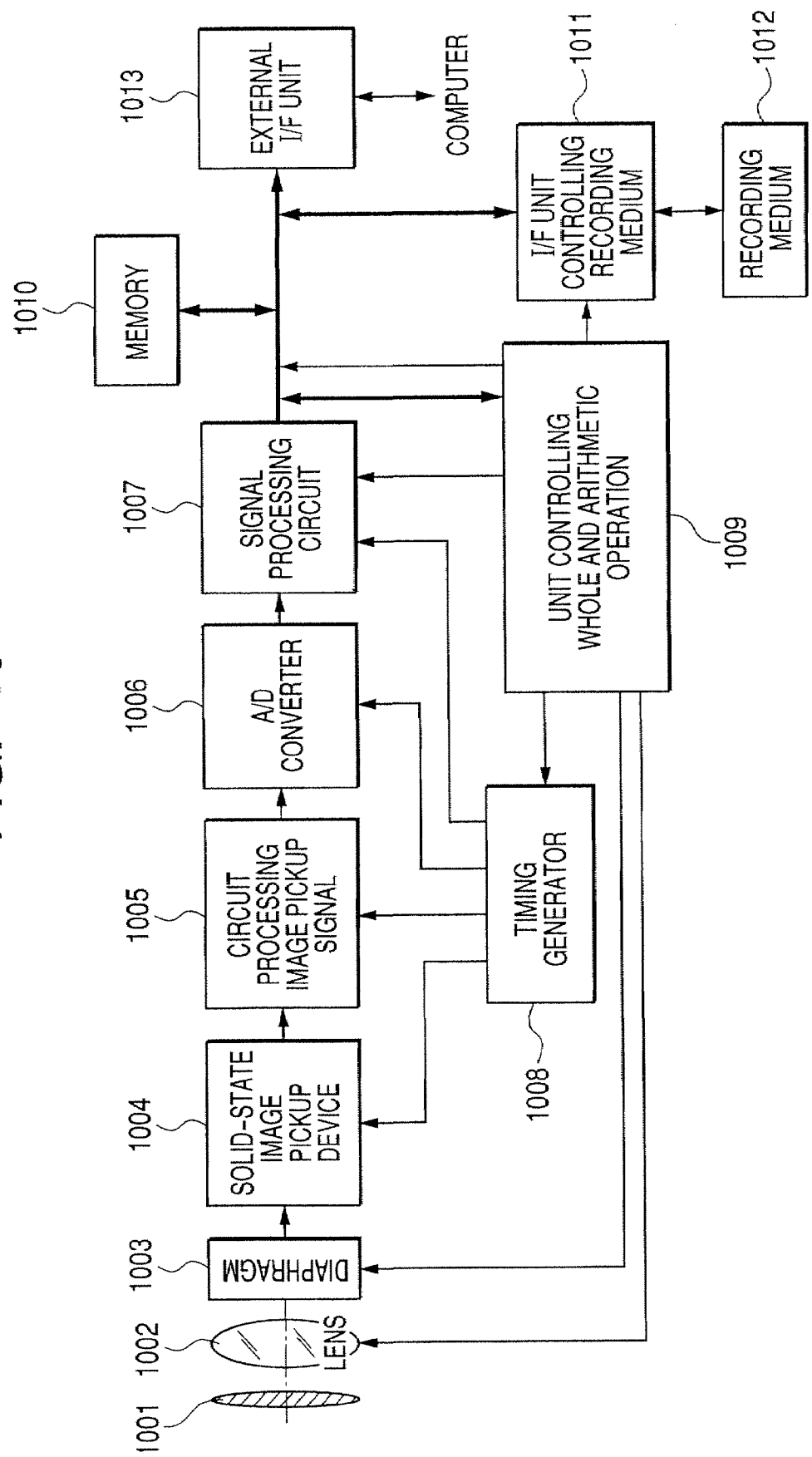
FIG. 19 is a block diagram showing a case of application of the photoelectric conversion device of the present invention to a still video camera.

FIG. 17 is a top view of a pixel-forming structure in a sixth embodiment of the present invention, including an active region 401, a transfer gate electrode 402, a photodiode region 403 and a readout region 404. Widths Dy1 and Dy2 are in a direction parallel to the transistor channel width. Widths Dy1 and Dy2 represent the width of a photodiode region. Ordinarily, the depletion voltage is increased at a larger-width portion. For this reason, a problem that complete transfer is difficult arises if a layout such as shown in FIG. 15, in which the width is reduced at a side closer to the transfer gate 402, is adopted. That is, a problem arises that the portion having the width Dy1 is completely depleted earlier than the portion having the width Dy2 at the time of reset or transfer, and a charge remains in the portion having the width Dy2 to generate reset noise. This problem is due to a size dependence of the deletion voltage under the influence of the extent of the depletion layer in a transverse direction (the direction along the widths Dy1 and Dy2). This problem is particularly serious in a case where the concentration in the vicinity of the well surface according to a design of a concrete structure is low and the depletion layer extends in the depth direction. In this embodiment, the extent of the depletion layer in the depth direction is limited to relieve restrictions on a layout, and generation of reset noise can be prevented even in a case where a layout such as shown in FIG. 17 is made. The reason for this effect will be described with reference to FIG. 18. FIG. 18 comprises schematic cross-sectional views taken along Dy1 and Dy2 in FIG. 17. Region 405 represents a depletion layer region extending in the photodiode and the well. The depth of the deletion layer region is indicated by Dz in FIG. 18. Region 406 represents neutral region finally remaining immediately before complete depletion is effected. The state of the depletion layer extending in the depth direction is indicated by 407, and the state of the depletion layer extending in a transverse direction (in the direction along the widths Dy1 and Dy2) is indicated by 408. In a case where complete depletion is caused by the effect of the depletion layer extending in the depth direction as shown in FIG. 18, there is substantially no layout dependence, the depletion voltage for depletion in the portion having the width Dy1 and the depletion voltage for depletion in the portion having the width Dy2 are equal to each other, and complete reset of the photodiode and complete transfer can be achieved. In the case of a structure in which Dy1 is smaller than that shown in FIG. 18 or in the case of a structure in which the extent 407 of the depletion layer in the depth direction is larger, complete depletion is effected in the place having the width Dy1 under the influence of the extent 408 of the depletion layer in the transverse direction and, therefore, the depletion voltage is reduced depending on the width Dy1. By considering the points described above, a structure described below is adopted to equalize the voltage for depletion in the portion having the width Dy1 and the voltage for depletion in the portion having the width Dy2 in this embodiment.

In a pixel-forming portion of a layout in which Dy2>Dy1, the well concentration is set so that the extent of the depletion layer in the depth direction is limited and Dy1>Dz.

In the structure according to this embodiment, a depletion voltage can be fixed with respect to any positions in a planar layout of the photodiode, thereby enabling high-speed operation and limiting image quality degradation due to reset noise.

A plurality of devices according to any one of the embodiments may be two-dimensionally arrayed to be used as an area sensor (solid-state image pickup device). Also, each of the readout regions described in the descriptions of the embodiments may be used in an amplification-type solid-state image pickup device (active pixel sensor) in which the readout region is connected to the gate of an insulating gate type of transistor and charge-to-voltage conversion is performed for readout.

While carriers in all the embodiments have been described as electrons, holes may function as carriers. In such a case, the conduction type of each impurity region may be changed to the opposite conduction type.

(Application to Image Pickup System)

FIG. 18 shows an example of circuit blocks in the case of an application of the photoelectric conversion device in accordance with the present invention to a camera. A shutter 1001 is provided in front of an imaging lens 1002 to control exposure. An image is formed on a solid-state image pickup device 1004 while the amount of light is controlled with a diaphragm 1003 as required. A signal output from the solid-state image pickup device 1004 is processed in a signal processing circuit 1005 and the analog signal from the signal processing circuit 1005 is converted into a digital signal by an A/D converter 1006. The digital signal output from the A/D converter 1006 further undergoes computational processing in a signal processing circuit 1007. The processed digital signal is stored in a memory 1010 and sent to an external device via an external I/F unit 1013. The solid-state image pickup device 1004, the signal processing circuit 1005, the A/D converter 1006 and the signal processing circuit 1007 are controlled by a timing generator 1008. A unit 1009 controlling the while and arithmetic operation controls the entire system. To record the image on a recording medium 1012, the output digital signal is recorded through an I/F unit 1011 controlling the recording medium controlled by the unit controlling the whole and arithmetic operation.

This application claims priorities from Japanese Patent Application Nos. 2003-415011 filed Dec. 12, 2003 and 2004-252310 filed Aug. 31, 2004, which are hereby incorporated by reference herein.

What is claimed is:

1. A method of manufacturing a photoelectric conversion device having a semiconductor substrate of a first conduction type, and having a photoelectric conversion element having an impurity region of the first conduction type which accumulates a signal carrier generated through photoelectric conversion, and a plurality of impurity regions of a second conduction type opposite to the first conduction type, said method comprising a step of forming the impurity region of the first conduction type and the plurality of impurity regions of the second conduction type by performing ion implantations in the semiconductor substrate a certain number of times, wherein said ion implantations of the certain number of times include a first ion implantation of forming the impurity region of the first conduction type, and second, third, and fourth ion implantations of forming the plurality of impurity regions of the second conduction type, wherein respective depths of the ion implantations of the certain number of times in the depth direction from an ion implantation surface of the semiconductor substrate are set in an order of the first, second, third and then fourth ion implantations, and respective peak impurity concentrations of the second conduction type impurity regions formed by the second, third, and fourth ion implantations are C1, C2, and C3 have a relationship of:

C3>C1>C2.

2. The method according to claim 1, further comprising a step of forming an impurity region of the second conduction type adjacent to the first conduction type impurity region on a surface side of the substrate.

3. The method according to claim 1, wherein the ion implantations for the impurity regions of the second conduction type are conducted in an order of the fourth, third, and then second ion implantations.

4. A method according to claim 1, wherein in said step of forming the plurality of impurity regions, after the ion implantations of the certain number of times have been performed, a thermal diffusion treatment is performed at such a temperature that each of the regions into which ions are implanted can maintain a profile having an impurity concentration peak.

5. The method according to claim 4, wherein a treatment temperature of said thermal diffusion treatment is equal to or lower than 950° C.

6. A method according to claim 1, wherein
the plurality of impurity regions of the second conduction type formed by the second, third, and fourth ion implantations have continuous impurity concentration profiles therebetween, respectively.

7. A method according to claim 1, wherein
the photoelectric conversion device includes a transfer MOS transistor for transferring the signal carrier generated through photoelectric conversion.

* * * * *